United States Patent [19]

Lesk

[11] Patent Number: 4,728,391
[45] Date of Patent: Mar. 1, 1988

[54] PEDESTAL TRANSISTORS AND METHOD OF PRODUCTION THEREOF

[75] Inventor: Israel A. Lesk, Phoenix, Ariz.

[73] Assignee: Motorola Inc., Schaumburg, Ill.

[21] Appl. No.: 48,345

[22] Filed: May 11, 1987

[51] Int. Cl.⁴ .................. H01L 21/306; B44C 1/22; C03C 15/00; C23F 1/02

[52] U.S. Cl. .................. 156/649; 156/653; 156/656; 156/657; 156/662; 357/43; 357/56; 437/21; 437/31; 437/34; 437/40; 437/46; 437/193; 437/200

[58] Field of Search ........... 156/643, 646, 649, 653, 156/656, 657, 659.1, 662; 437/21, 27, 31, 34, 40, 46, 193, 200, 56–58; 357/34, 43, 44, 67, 71, 23.1, 23.14, 40–43, 56, 59

[56] References Cited

U.S. PATENT DOCUMENTS

| | | | |
|---|---|---|---|
| 4,642,880 | 2/1987 | Mizutani et al. | 156/649 X |
| 4,648,941 | 3/1987 | Blanchard | 156/657 |
| 4,657,630 | 4/1987 | Agatsuma | 156/643 |
| 4,675,984 | 6/1987 | Hsu | 156/653 X |
| 4,698,126 | 10/1987 | Van Roosmalen et al. | 156/657 X |

Primary Examiner—William A. Powell
Attorney, Agent, or Firm—Raymond J. Warren

[57] ABSTRACT

The present invention describes a method of producing an MOS, bipolar and Bimos pedestal transistor wherein the source, drain, and gate metals are in place prior to the source/drain diffusion in a MOS transistor; and the emitter and base metals are in place before junction formation on the bipolar transistors. This is accomplished in MOS devices by a first blanket implantation of impurities into a first polysilicon layer during processing and a second blanket implantation into a second polysilicon layer subsequent to deposition of the metal layers. This is accomplished in bipolar devices by the above, or by blanket implantations subsequent to the deposition of the metal layers.

22 Claims, 38 Drawing Figures

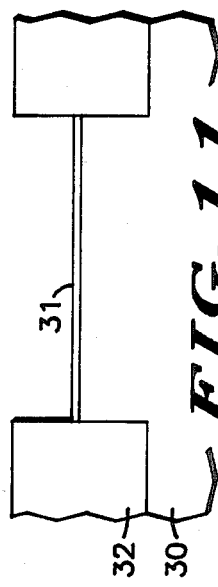
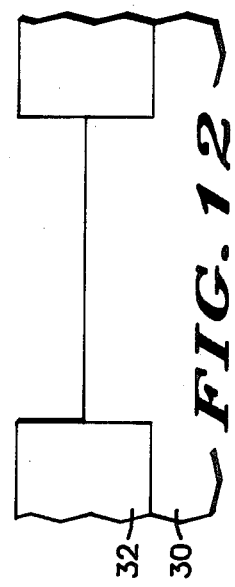
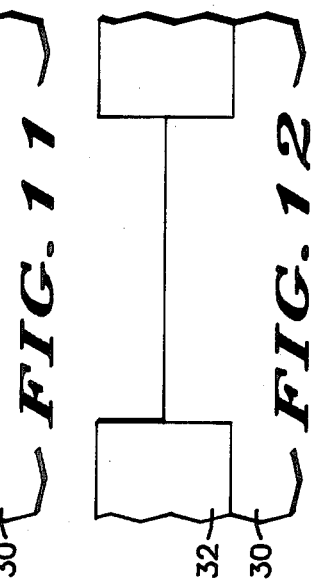
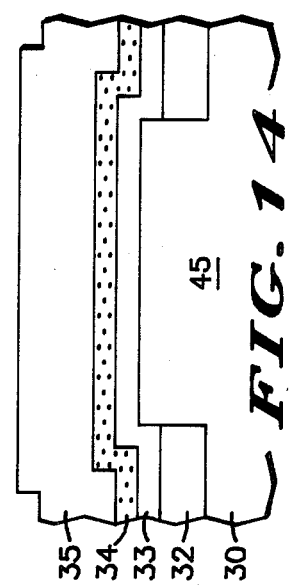
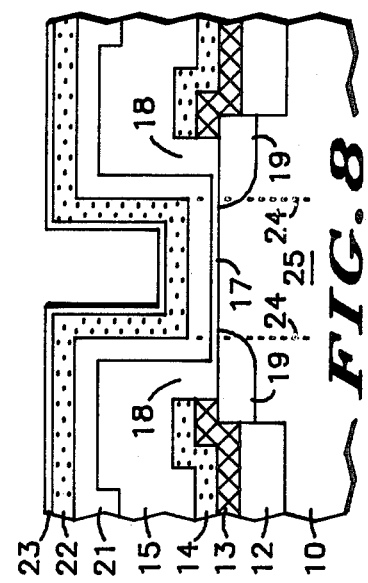
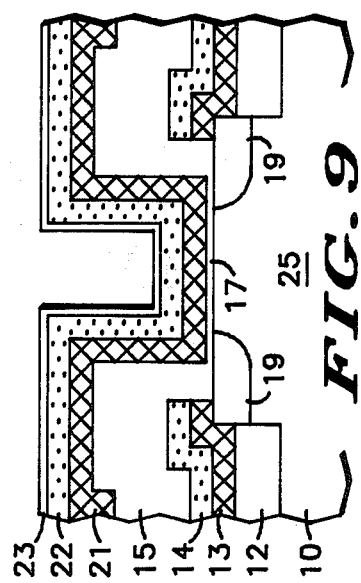
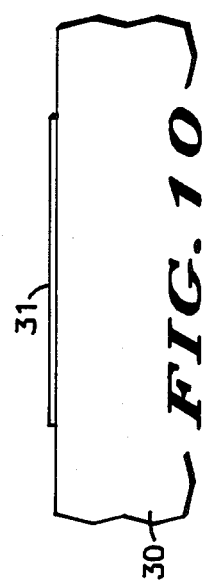

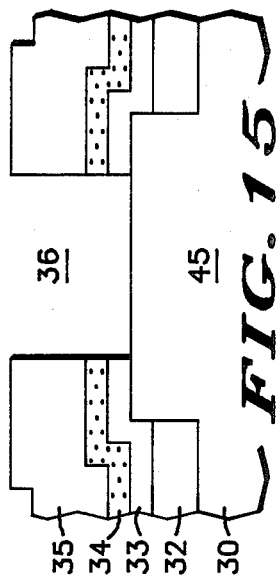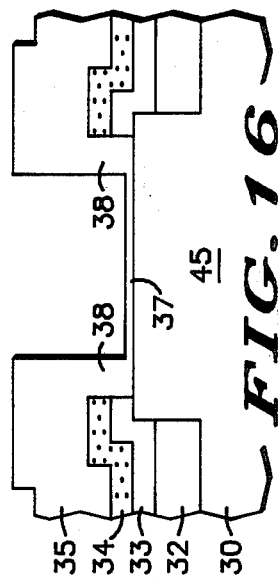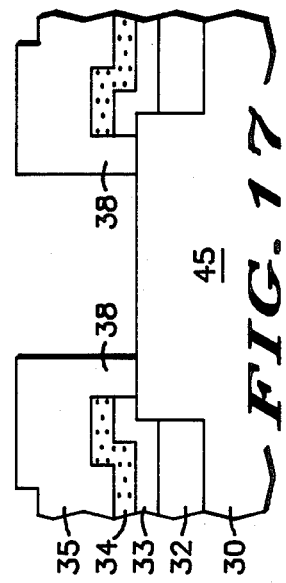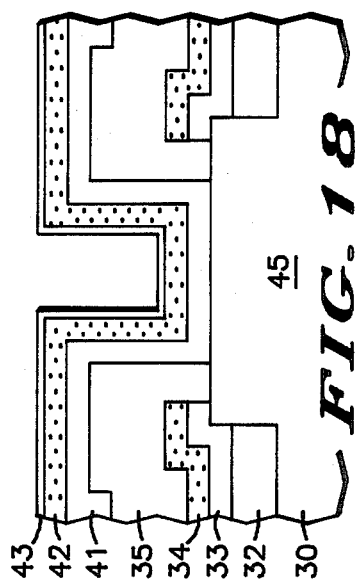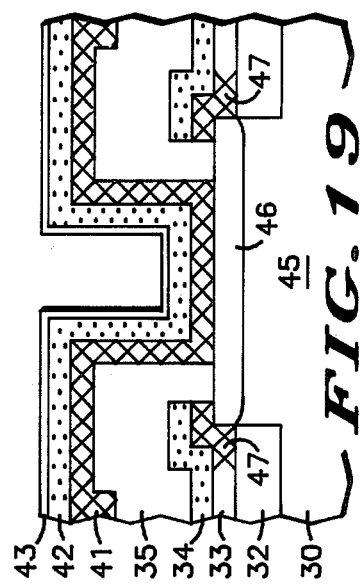

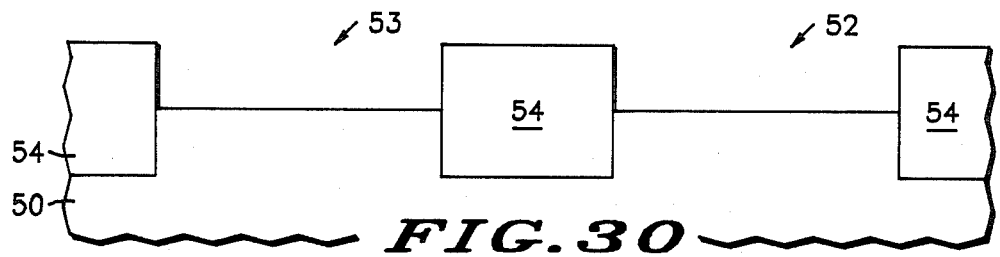
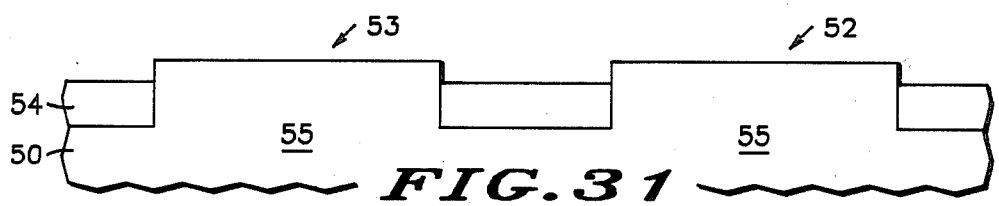
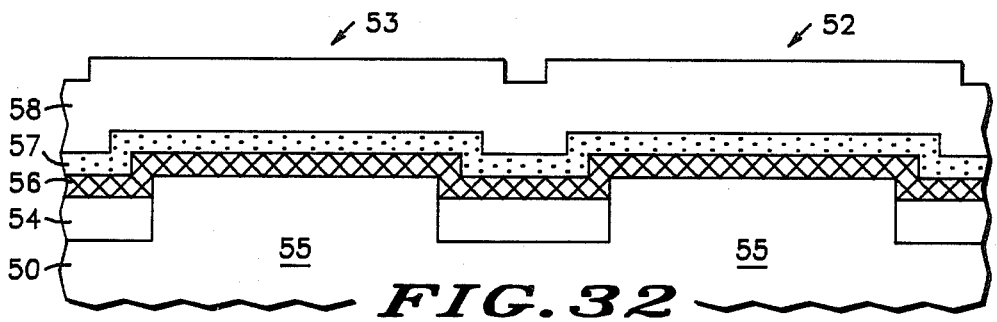
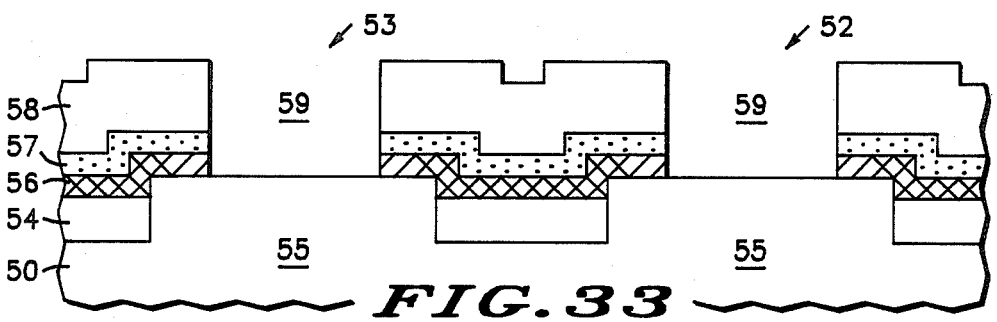
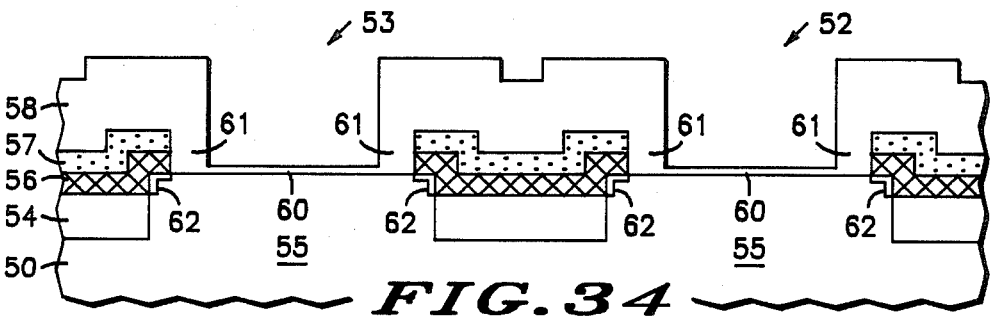

PEDESTAL TRANSISTORS AND METHOD OF PRODUCTION THEREOF

BACKGROUND OF THE INVENTION

The present invention relates, in general, to pedestal transistors and, more particularly: to MOS transistors with source, drain and base metal in place before source-drain diffusion; and to bipolar transistors with emitter and base metal in place before junction formation.

Various types of MOS and bipolar transistors, and Bimos integrated circuits are known in the art. MOS transistors are produced by first performing a source and drain diffusion and then putting the source, drain, and gate metals in place. Bipolar transistors are fabricated by first forming the junctions and then depositing the emitter and base metals. This requires extra processing steps and results in higher values of parasitics in the final product. There are also a number of critical alignment steps associated with this prior type of processing.

SUMMARY OF THE INVENTION

Accordingly, it is an object of the present invention to provide a pedestal transistor that overcomes the above deficiencies A further object of the present invention is to provide a pedestal transistor that has minimal parasitics.

Another object of the present invention is to provide a pedestal transistor that has only one critical alignment step.

Still another object of the present invention is to provide a pedestal transistor that is capable of less than one micrometer geometrical features.

Yet another object of the present invention is to provide a pedestal transistor fabricated under either MOS, Bipolar or Bimos technologies.

Another object of the present invention is to provide an MOS pedestal transistor wherein the gate doping follows independent source/drain doping.

Still another object of the present invention is to provide a pedestal transistor that is formed using blanket implanting of impurities.

A particular embodiment of the present invention comprises method of producing an MOS pedestal transistor comprising the steps: forming a substrate having a pedestal; depositing a first polysilicon layer of a first conductivity type, a first tungsten silicide layer, and a silicon dioxide layer on the substrate; etching an opening through the silicon dioxide, first tungsten silicide, and first polysilicon layers to the pedestal of said substrate; forming a gate dielectric on the pedestal and a side wall insulator about said side wall defining the opening; depositing a second polysilicon layer, a second tungsten silicide layer, and a silicon nitride layer on the wafer; baking the wafer causing the impurity of the first polysilicon layer to diffuse into the pedestal; and implanting a second impurity into the second polysilicon layer.

BRIEF DESCRIPTION OF THE DRAWINGS

FIGS. 1-9 illustrate process flow diagrams of a MOS pedestal transistor embodying the present invention;

FIGS. 10-20 illustrate process flow diagrams of a Bipolar pedestal transistor embodying the present invention;

FIGS. 28-38 illustrate process flow diagrams of a Bimos fabrication embodying the present invention.

DETAILED DESCRIPTION OF THE DRAWINGS

Referring to FIGS. 1-9, process flow diagrams of a particular MOS pedestal transistor embodying the present invention are illustrated. It should be noted here that the figures used to illustrate the present invention are shown with vertical walls. This is for illustration purposes and is not meant to limit the invention. While it is possible to obtain this type of straight walls using trench etching techniques, most commonly used techniques will have trenches with angled walls.

Figure 1:
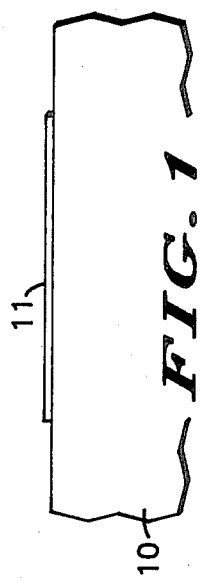
Figure 2:
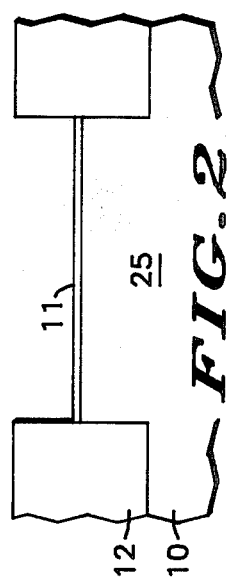

In FIG. 1, the process is commenced by masking a substrate 10, such as an n-type silicon substrate, with a silicon nitride ($Si_3N_4$) mask 11. Next, the wafer is thermally oxidized to produce an oxide 12 ($SiO_2$), FIG. 2. Oxide layer 12 is approximately 10,000 Angstroms thick. As shown, about half of oxide 12 extends above the original surface.

Figure 3:
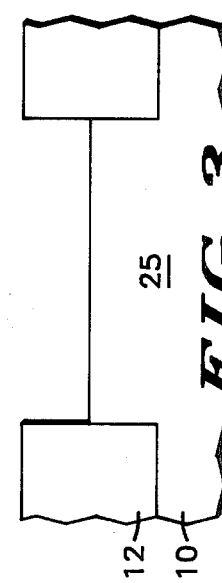
Figure 4:
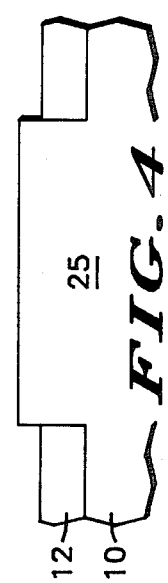
Figure 23:
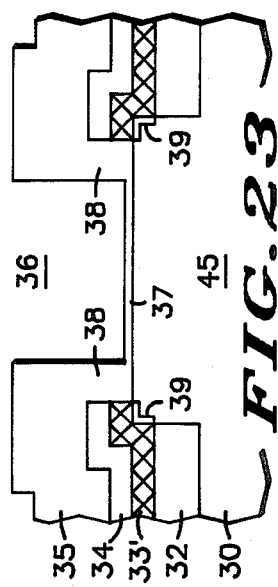
FIGS. 21-27 illustrate process flow diagrams of a second embodiment of a Bipolar pedestal transistor embodying the present invention.

Following the oxidation, mask 11 is removed, FIG. 3. Next, as shown in FIG. 4, oxide 12 is etched to leave a pedestal structure 25 approximately 2,000 Angstroms above the surface of oxide 12.

Figure 5:
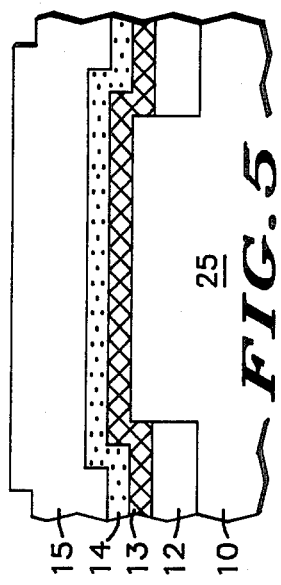

Referring to FIG. 5, a polysilicon layer 13, approximately 500 Angstroms thick, is deposited over the surface of the wafer. Layer 13 is blanket doped with boron, forming p-type silicon. This doping can be performed either in situ during deposition or by diffusion or implantation after deposition. Layer 13 is crosshatched to illustrate that this is a p-type layer. A layer 14 of tungsten silicide (WSi), approximately 1500 Angstroms thick, is then deposited upon layer 13 at a temperature of approximately 360° C. A layer 15 of silicon dioxide ($SiO_2$), approximately 3000 Angstroms thick, is then deposited over the surface of layer 14.

Figure 6:
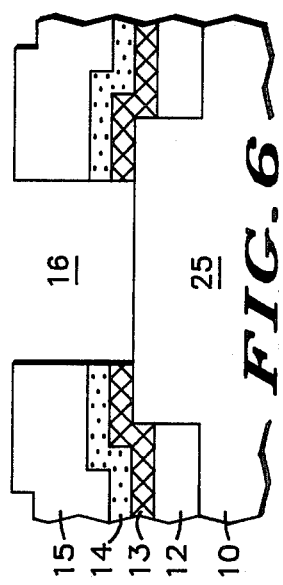
Figure 7:
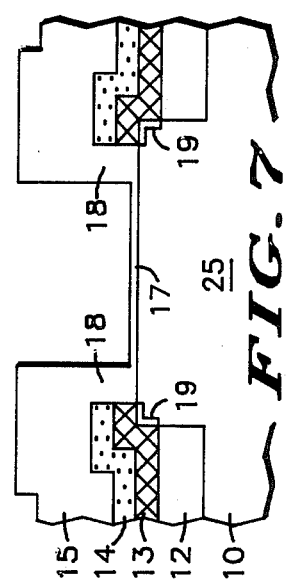

The wafer is then masked and a hole 16 etched through layers 15, 14 and 13 to expose the surface of pedestal 25, FIG. 6. This is the only critical alignment step in the process. The next step is to form the gate dielectric. In FIG. 7, the wafer has been heated in the presence of oxygen to form a silicon dioxide gate dielectric 17. An optional method would be to form a $SiO_xN_y$ layer 17. This heating step also causes exposed portions of layers 13 and 14 to oxidize forming a side wall insulator 18. As shown, the edges of tungsten silicide layer 14 and polysilicon layer 13 oxidize at a faster rate than substrate 10. In addition, the heating causes part of the doping of layer 13 to diffuse into substrate 10 at points 19.

Referring now to FIG. 8, a second layer 21 of polysilicon is disposed over the entire wafer. This is followed by a second layer 22 of tungsten silicide and a thin layer 23 of silicon nitride. Silicon nitride 23 serves to prevent evaporation of dopant during subsequent heat cycles. See "Retention of Phosphorus in Silicon Beneath Tungsten Silicide Contacts During High Temperature Cycles", I. A. Lesk et al., 6 Motorola Technical Developments 31 (Oct. 1986).

The wafer is then baked to approximately 1000° C. to crystallize the tungsten silicide. This baking step causes the impurity in layer 13 to diffuse further laterally, areas 19, into the edges of pedestal 25. It is desired that areas 19 diffuse laterally at least to the point illustrated by dashed lines 24. This baking also causes tungsten silicide layers 14 and 22 to form a large grain stoichiometric high conductivity (30-50 micro-ohm-centimeters) layer. During the grain growth the excess silicon deposits on underlying polysilicon layers 13 and 21 so that their thickness will be approximately 600 Angstroms.

A second blanket implant of boron is implanted through silicon nitride layer 23. This is then heated and diffused through tungsten silicide layer 22 and into polysilicon layer 21. This is illustrated in FIG. 9 by the crosshatched layer 21.

It should be noted here that while boron was used above in this example to form p-type gate, source and drain regions, this can be replaced with an n-type doping, such as arsenic, or a combination of n- and p-type doping. In addition, it will be appreciated by those skilled in the art, after reviewing the above, that this may also be applied to CMOS structures.

Thus, it has been shown that the present invention provides a MOS pedestal transistor that has minimal parasitics and only one critical alignment step.

Referring now to FIGS. 10-20, process flow diagrams of a particular embodiment of a Bipolar device embodying the present invention are illustrated. In FIG. 10, the process is commenced by masking a substrate 30, such as an n-type silicon substrate, with a silicon nitride mask 31. Next, the wafer is thermally oxidized to produce an oxide 32, FIG. 11. Oxide layer 32 is approximately 10,000 Angstroms thick with about half extending above the original surface of the wafer.

Following the oxidation, mask 31 is removed, FIG. 12. Next, as shown in FIG. 13, oxide 32 is etched to leave a pedestal structure 45 approximately 2,000 Angstroms above the surface of oxide 32.

Referring to FIG. 14, a polysilicon layer 33 is deposited over the surface of the wafer. A layer 34 of tungsten silicide (WSi$_2$) is then deposited upon polysilicon layer 33. Tungsten silicide layer 34 is deposited at approximately 360° C. A layer 35 of silicon dioxide (SiO$_2$) is then deposited over the surface of tungsten silicide layer 34.

The wafer is then masked and a hole 36 etched through layers 35, 34 and 33 to expose the surface of pedestal 45, FIG. 15. This is the only critical alignment step in the process. The wafer is then heated in the presence of oxygen forming a silicon dioxide layer 37. This heating step causes exposed portions of layers 33 and 34 to oxidize forming a side wall insulator 38. As shown, the edges of tungsten silicide layer 34 and polysilicon layer 33 oxidize at a faster rate than substrate 30. Next, in FIG. 17, oxide 35/37 is etched until thin oxide layer 37 is removed, leaving side wall insulator 38 substantially intact.

Referring now to FIG. 18, a second layer 41 of polysilicon is deposited over the entire wafer. This is followed by a second layer 42 of tungsten silicide and a thin layer 43 of silicon nitride.

The wafer is then baked to approximately 1000° C. to crystallize the tungsten silicide. This baking step will tend to remove impurities from pedestal 45, through polysilicon layer 41 and into tungsten silicide layer 42. This effect may be enhanced by depositing silicon nitride layer 43 after the baking step. This would allow some of the impurities to evaporate from the surface of tungsten silicide layer 42.

The base is then formed by blanket ion-implant of boron through silicon nitride layer 43 and into tungsten silicide layer 42. This is then heated to diffuse the boron through tungsten silicide layer 42 and into polysilicon layer 41. In addition, since silicon dioxide layer 37 was removed, the boron will diffuse into the surface of pedestal 45 forming a p-type base 46. The boron will also diffuse laterally from pedestal 45 into a portion 47 of polysilicon layer 33, giving it a p-type doping. This p-type doping is illustrated in FIG. 19 by the crosshatching.

Figure 20:
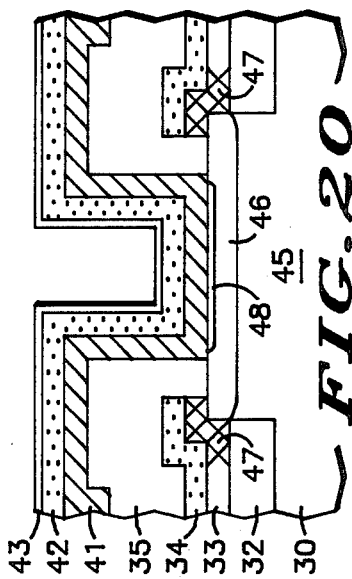

A second blanket ion-implant step with arsenic is then performed to form an n-type emitter 48. As shown in FIG. 20, a high dose of arsenic is ion-implanted through silicon nitride layer 43 into tungsten silicide layer 42. The wafer is then heated, for a short cycle, to drive the n-type impurity from tungsten silicide layer 42 into polysilicon layer 41 and into a portion 48 of pedestal 45.

It should be noted here that, while the present embodiment has been provided with a p-type base and an n-type emitter, these doping types may be reversed. In addition, those of skill in the art will appreciate, after reviewing the above, that using a base impurity with a diffusion coefficient larger than that of the emitter impurity would allow the two blanket ion-implants to be combined in a double implant with one thermal step.

Thus, it has been shown that the present invention provides a Bipolar pedestal transistor that has minimal parasitics and only one critical alignment step.

Figure 21:
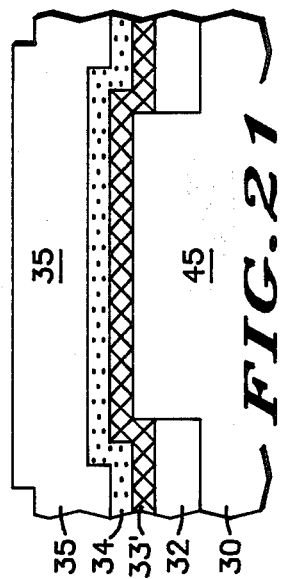

Referring now to FIGS. 21-27, process flow diagrams of a second embodiment of a Bipolar pedestal transistor embodying the present invention are illustrated. The beginning steps of this process are identical to the steps in FIGS. 10-13 above and will not be repeated here. FIG. 21 commences at the point of FIG. 14 above with like elements labeled with the same numerical designation and with differing elements designated with a prime (').

Referring to FIG. 21, a polysilicon layer 33' is deposited over the surface of the wafer. A layer 34 of tungsten silicide is then deposited upon polysilicon layer 33'. Layer 34 is deposited at approximately 360° C. A layer 35 of silioon dioxide is then deposited over the surface of tungsten silicide layer 34. Polysilicon layer 33' is blanket doped with boron, forming a p-type silicon. This doping can be performed either in situ during deposition or by diffusion or implantation after deposition. Layer 33' is crosshatched to illustrate that this is a p-type layer.

Figure 22:
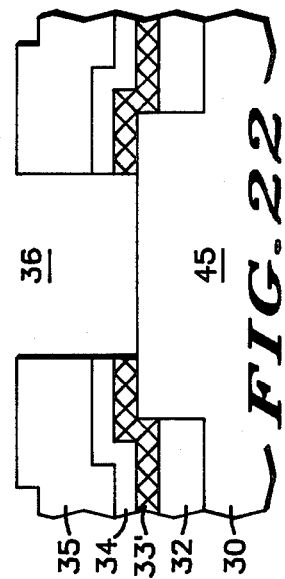

The wafer is then masked and a hole 36 etched through layers 35, 34 and 33' to expose the surface of pedestal 45, FIG. 22. This is the only critical alignment step in the process. The wafer is then heated in the presence of oxygen forming a silicon dioxide layer 37, FIG. 23. This heating step causes exposed portions of layers 33' and 34 to oxidize forming side wall insulator 38. As shown, the edges of tungsten silicide layer 34 and polysilicon layer 33' oxidize at a faster rate than substrate 30. In addition, the heating causes part of the doping of polysilicon layer 33' to diffuse into substrate 30 at points 39.

Figure 24:
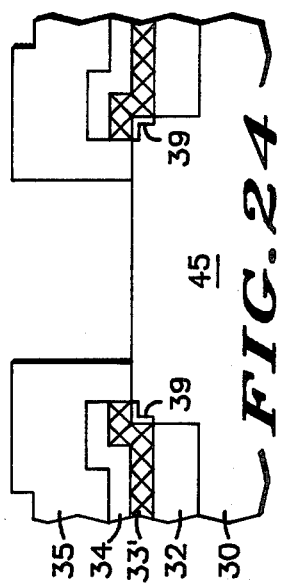

Next, in FIG. 24, oxide 35/37 is etched until thin oxide layer 37 is removed, leaving side wall insulator 38 substantially intact.

Figure 25:
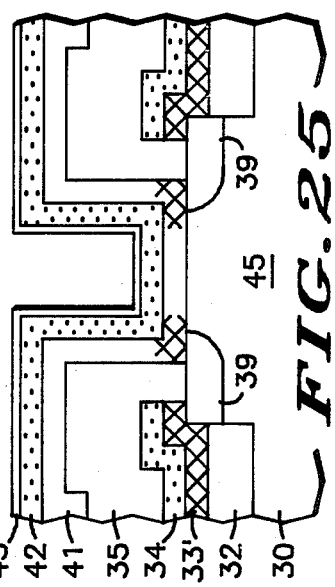

Referring now to FIG. 25, a second layer 41 of polysilicon is deposited over the entire wafer. This is followed by a second layer 42 of tungsten silicide and a thin layer 43 of silicon nitride.

The wafer is then baked to approximately 1000° C. to crystallize the tungsten silicide. This baking step will tend to remove impurities from pedestal 45, through polysilicon layer 41 and into tungsten silicide layer 42. This effect may be enhanced by depositing silicon nitride layer 43 after the baking step. This would allow some of the impurities to evaporate from the surface of tungsten silicide layer 42. In addition, there is further diffusion of boron into the areas 39 of pedestal 45. This will provide a low base resistance and help to prevent emitter encroachment to the base contact.

Figure 26:
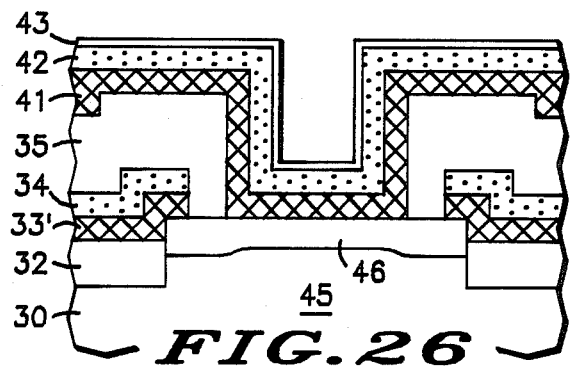

The base is then formed by a blanket ion-implant of boron through silicon nitride layer 43 and into tungsten silicide layer 42. This is then heated and diffused through tungsten silicide layer 42 and into polysilicon layer 41. In addition, since silicon dioxide layer 37 was removed, the boron will diffuse into the surface of pedestal 45 forming a p-type base 46. This p-type impurity is illustrated in FIG. 26 by the crosshatching.

Figure 27:
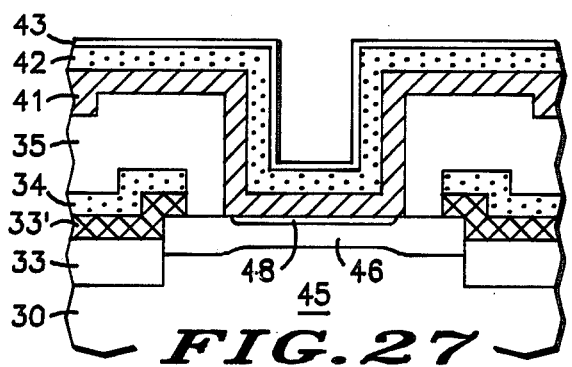

A second blanket ion-implant step with arsenic is then performed to form an n-type emitter. As shown in FIG. 27, a high dose of arsenic is ion-implanted through silicon nitride layer 43 into tungsten silicide layer 42. The wafer is then heated, for a short cycle, to drive the n-type impurity from tungsten silicide layer 42 into polysilicon layer 41 and into an emitter portion 48 of pedestal 45.

It should be noted here that while the present embodiment has been provided with a p-type base and an n-type emitter, that these doping types may be reversed. In addition, those of skill in the art will appreciate, after reviewing the above, that using a base impurity with a diffusion coefficient larger than that of the emitter impurity would allow the two blanket ion-implants to be combined in a double implant with one thermal step.

Thus, it has been shown that the present invention provides a Bipolar pedestal transistor that has minimal parasitics and only one critical alignment step.

Figure 28:
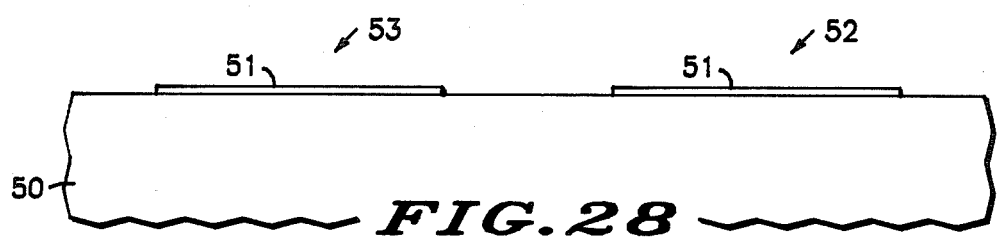
Figure 29:
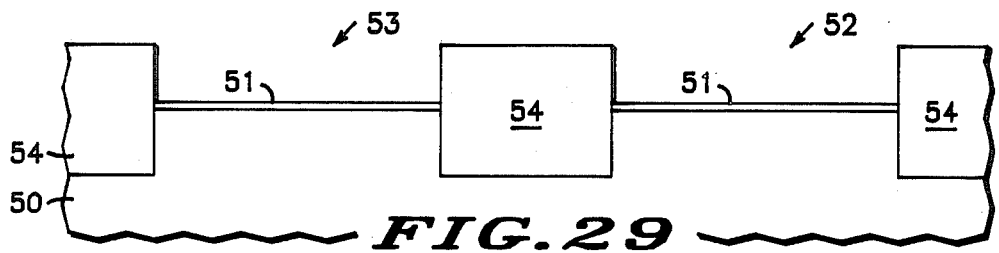
Figure 35:
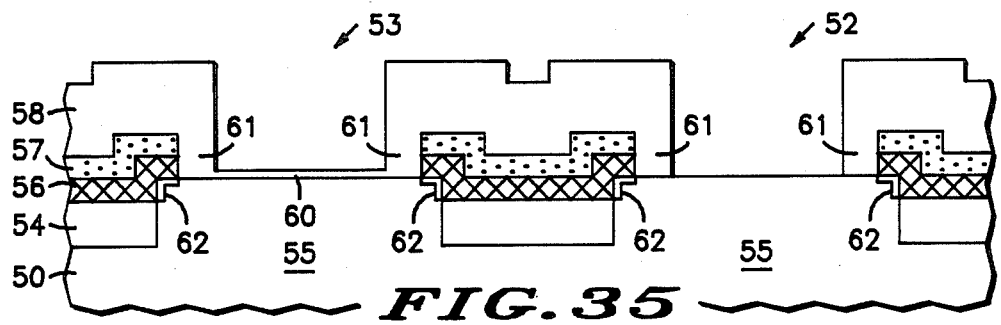

Referring to FIGS. 28-38, process flow diagrams of a particular embodiment of a Bimos pedestal transistor embodying the present invention are illustrated. In FIG. 28, the process is commenced by masking a substrate 50, such as an n-type silicon substrate, with a silicon nitride ($Si_3N_4$) mask 51. An area 53 represents the formation of a MOS transistor and an area 52 represents a Bipolar transistor. Next, the wafer is thermally oxidized to produce an oxide 54 ($SiO_2$), FIG. 29. Oxide layer 54 is approximately 10,000 Angstroms thick. As shown about half of oxide 54 extends above the original surface.

Following the oxidation, mask 51 is removed, FIG. 30. Next, as shown in FIG. 31, oxide 54 is etched to leave pedestals 55 approximately 2,000 Angstroms above the surface of oxide 12.

Referring to FIG. 32, a polysilicon layer 56 is deposited over the surface of the wafer. Layer 56 is blanket doped with boron, forming a p-type silicon. This doping can be performed either in situ during deposition or by diffusion or implantation after deposition. Layer 56 is crosshatched to illustrate that this is a doped layer. A layer 57 of tungsten silicide ($WSi_2$) is then deposited upon layer 56. Layer 57 is deposited at approximately 360° C. A layer 58 of silicon dioxide ($SiO_2$) is then deposited over the surface of layer 57.

The wafer is then masked and holes 59 etched through layers 58, 57 and 56 to expose the surfaces of pedestals 55, FIG. 33. This is the only critical alignment step in the process. The next step is to form the gate dielectric for MOS device 53. The wafer is heated in the presence of oxygen to form a silicon dioxide gate dielectric 60. An optional method would be to form a $SiO_xN_y$ layer 60. This heating step also causes exposed portions of layers 56 and 57 to oxidize forming side wall insulator 61. As shown, the edges of tungsten silicide layer 57 and polysilicon layer 56 oxidize at a faster rate than substrate 50. In addition, the heating causes part of the doping of layer 56 to diffuse into substrate 50 at points 62.

Next, MOS device 53 is masked and oxide 60 of Bipolar device 52 is etched away. This leaves the device shown in FIG. 35.

Figure 36:
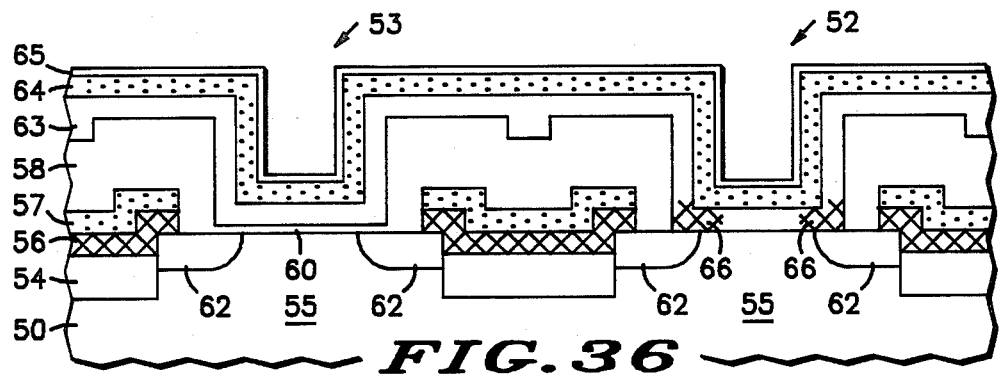

Referring now to FIG. 36, a second layer 63 of polysilicon is disposed over the entire wafer. This is followed by a second layer 64 of tungsten silicide and a thin layer 65 of silicon nitride.

The wafer is then baked to approximately 1000° C. to crystallize the tungsten silicide. This baking step causes the impurity in layer 56 to diffuse further laterally, areas 62, into the edges of pedestal 55. In Bipolar device 52, portions 66 of polysilicon layer 63 are also doped from the diffused boron from polysilicon layer 56. This baking also causes tungsten silicide layers 57 and 64 to form a large grain stoichiometric high conductivity (30-50 micro-ohm-centimeters) layer. During the grain growth the excess silicon deposits on underlying polysilicon layers 56 and 63 so that their thickness will be approximately 600 Angstroms.

Figure 37:
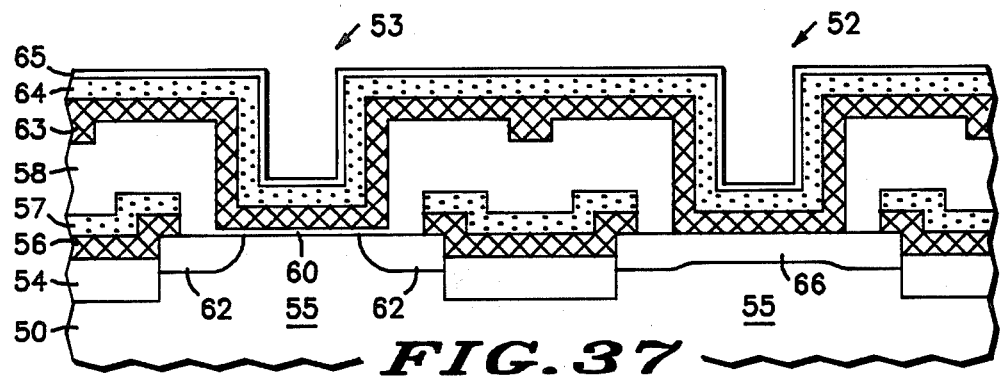

A second blanket implant of boron is implanted through silicon nitride layer 65 into tungsten silicide layer 64. The wafer is then heated and the boron diffused from tungsten silicide layer 64 and into polysilicon layer 63. This is illustrated in FIG. 37 by the crosshatched layer 63. In addition, since silicon dioxide layer 60 was removed from Bipolar device 52, the boron will diffuse into the surface of pedestal 55 of Bipolar device 52 forming a p-type base 66.

Figure 38:
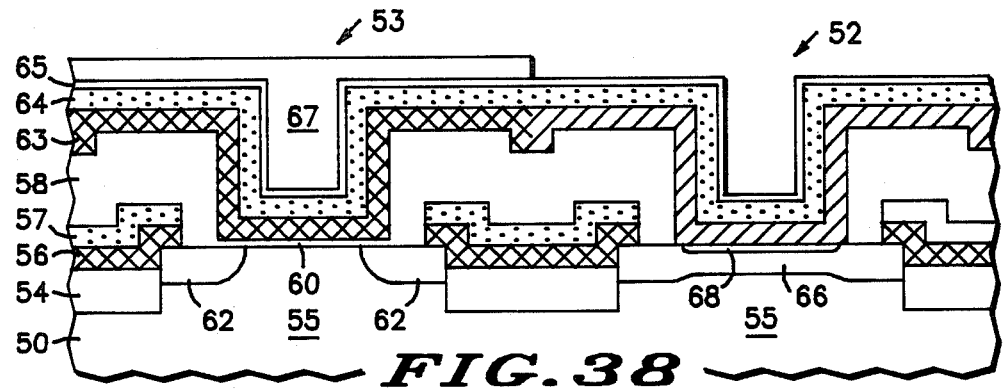

A masking layer 67 is then placed over MOS device 53 and a second blanket ion-implant step with arsenic is then performed to form an n-type emitter 68 of Bipolar device 52. Layer 67 serves to prevent polysilicon layer 64 of MOS device 53 from being doped. It should be noted that if a different threshold voltage for MOS device 53 is desired, layer 67 may be omitted so that layer 64 of MOS device 53 is doped at this time. As shown in FIG. 38, a high dose of arsenic is ion-implanted through silicon nitride layer 65 into tungsten silicide layer 64. The wafer is then heated, for a short cycle, to drive the n-type impurity from tungsten silicide layer 64 into polysilicon layer 63 and into an emitter portion 68 of Bipolar device pedestal 55.

Thus, it has been shown that the present invention provides Bimos pedestal transistors that have minimal parasitics and only one critical alignment step.

I claim:

1. A method of producing an MOS pedestal transistor comprising the steps:

forming a substrate having a pedestal;

depositing a first polysilicon layer of a first conductivity type;

depositing a first tungsten silicide layer on said first polysilicon layer;

depositing a silicon dioxide layer on said first tungsten silicide layer;

producing an opening through said silicon dioxide, first tungsten silicide, and first polysilicon layers to said pedestal of said substrate, said opening being defined by a side wall;

forming a gate dielectric on said pedestal;

forming a side wall insulator about said side wall defining said opening;

depositing a second polysilicon layer;

depositing a second tungsten silicide layer on said second polysilicon layer;

baking said MOS pedestal transistor causing a portion of said first impurity of said first polysilicon layer to diffuse into a portion of said pedestal; and implanting a second impurity into said second polysilicon layer.

2. The method of claim 1 wherein said step of forming a substrate having a pedestal comprises the steps of:

masking a pedestal region of said substrate;

oxidizing said substrate producing an oxide layer extending above a surface of said substrate; and etching said oxide to a level below said surface of said substrate.

3. The method of claim 1 wherein said step of producing an opening comprises the steps of:

masking said MOS pedestal device delineating an area on said silicon dioxide layer disposed above said pedestal; and etching said silicon dioxide, tungsten silicide, and first polysilicon layers.

4. The method of claim 1 wherein said steps of forming a gate dielectric and forming a side wall insulator comprise the steps of:

oxidizing said pedestal forming a layer of oxide on a surface of said pedestal; and oxidizing a portion of said first tungsten silicide and first polysilicon layers adjacent said side wall defining the opening.

5. The method of claim 1 wherein said first conductivity type is a negative conductivity type.

6. The method of claim 1 wherein said portion of said first impurity of said first polysilicon layer to diffuse into said portion of said pedestal forms a source and a drain of said MOS pedestal transistor.

7. The method of claim 1 further comprising the step of depositing a silicon nitride layer on said second tungsten silicide layer 8. A method of producing a Bipolar pedestal transistor comprising the steps:

forming a substrate having a pedestal;

depositing a first polysilicon layer;

depositing a first tungsten silicide layer on said first polysilicon layer;

depositing a silicon dioxide layer on said first tungsten silicide layer;

producing an opening through said silicon dioxide, first tungsten silicide, and first polysilicon layers to said pedestal of said substrate, said opening being defined by a side wall;

forming a side wall insulator about said side wall defining said opening;

depositing a second polysilicon layer;

depositing a second tungsten silicide layer on said second polysilicon layer;

forming a base; and forming an emitter.

9. The method of claim 8 wherein said step of forming a substrate having a pedestal comprises the steps of:

masking a pedestal region of said substrate;

oxidizing said substrate producing an oxide layer extending above a surface of said substrate; and etching said oxide to a level below said surface of said substrate.

10. The method of claim 8 wherein said step of producing an opening comprises the steps of:

masking said MOS pedestal device delineating an area on said silicon dioxide layer disposed above said pedestal; and etching said silicon dioxide, tungsten silicide, and first polysilicon layers.

11. The method of claim 8 wherein said step of forming a side wall insulator comprise the step of oxidizing a portion of said first tungsten silicide and first polysilicon layers adjacent said side wall defining the opening.

12. The method of claim 8 wherein said step of forming a base comprises the steps of:

blanket implanting a first impurity into said second tungsten silicide layer; and diffusing said first impurity through the second polysilicon layer forming a base portion of said pedestal adjacent said second polysilicon layer and coupled to the region diffused from said first polysilicon layer adjacent said portion of said pedestal.

13. The method of claim 8 wherein said step of forming an emitter comprises the steps of:

blanket implanting a second impurity into said second tungsten silicide layer; and diffusing it through the second polysilicon layer and into said pedestal to form an emitter portion of said pedestal adjacent said second polysilicon layer.

14. The method of claim 8 further comprising the step of depositing a layer of silicon nitride on said second tungsten silicide layer.

15. A method of producing a Bimos pedestal transistor comprising the steps:

forming a substrate having a first and a second pedestal;

depositing a first polysilicon layer of a first conductivity type;

depositing a first tungsten silicide layer on said first polysilicon layer;

depositing a silicon dioxide layer on said first tungsten silicide layer;

producing a first and a second opening through said silicon dioxide, first tungsten silicide, and first polysilicon layers to said first and second pedestals of said substrate, each of said first and second openings being defined by side walls;

forming a gate dielectric on said first pedestal;

forming a side wall insulator about each of said side walls defining said first and second openings;

depositing a second polysilicon layer;

depositing a second tungsten silicide layer on said second polysilicon layer;

baking said Bimos pedestal transistor causing a portion of said first impurity of said first polysilicon layer to diffuse into a portion of said first and second pedestals adjacent said first polysilicon layer; and implanting a second impurity of a first conductivity type into said second polysilicon layer;

diffusing said second impurity through said second polysilicon layer into a base portion of said second pedestal adjacent to said second polysilicon layer;

implanting a third impurity of a second conductivity type into a Bipolar portion of said second polysilicon layer; and diffusing said third impurity through said second polysilicon layer into an emitter portion of said second pedestal adjacent to said second polysilicon layer.

16. The method of claim 15 wherein said step of forming a substrate having a first and a second pedestal comprises the steps of:
   masking a first and a second pedestal region of said substrate;
   oxidizing said substrate producing an oxide layer extending above a surface of said substrate; and
   etching said oxide to a level below said surface of said substrate.

17. The method of claim 15 wherein said step of producing a first and a second opening comprises the steps of:
   masking said Bimos pedestal device delineating a first and a second area on said silicon dioxide layer disposed above said first and second pedestals, respectively; and
   etching said silicon dioxide, tungsten silicide, and first polysilicon layers.

18. The method of claim 15 wherein said steps of forming a gate dielectric comprise the steps of oxidizing said first pedestal forming a layer of oxide on a surface of said first pedestal.

19. The method of claim 15 wherein said steps of forming a side wall insulator comprises the steps of oxidizing a portion of said first tungsten silicide and first polysilicon layers adjacent said side walls defining said first and second openings.

20. The method of claim 15 wherein said first conductivity type is a positive conductivity type and said second conductivity type is a negative conductivity type.

21. The method of claim 15 wherein said portion of said first impurity of said first polysilicon layer to diffuse into said portion of said first pedestal forms a source and a drain of a MOS portion of said Bimos pedestal transistor.

22. The method of claim 15 further comprising the step of depositing a layer of silicon nitride on said second tungsten silicide layer.

* * * * *